United States Patent [19]

Tower

[11] Patent Number: 6,111,198
[45] Date of Patent: Aug. 29, 2000

[54] DUPLEX FEEDTHROUGH AND METHOD THEREFOR

[75] Inventor: Steven A. Tower, North Dartmouth, Mass.

[73] Assignee: Olin Aegis, New Bedford, Mass.

[21] Appl. No.: 09/094,807

[22] Filed: Jun. 15, 1998

[51] Int. Cl.[7] .................................................. H01J 5/00
[52] U.S. Cl. ................ 174/50.56; 174/65 R; 174/50.61; 174/135; 29/843
[58] Field of Search ............................ 174/50.56, 65 SS, 174/65 R, 135, 152 GM, 50.61, 151, 50.62; 29/893, 879

[56] References Cited

U.S. PATENT DOCUMENTS

| | | | |
|---|---|---|---|
| 3,136,932 | 6/1964 | Trent | 257/729 |
| 3,220,815 | 11/1965 | McMillan et al. | 65/32.2 |
| 3,436,109 | 4/1969 | Loose | 287/189.365 |
| 3,901,772 | 8/1975 | Guillotin et al. | 204/16 |
| 3,920,888 | 11/1975 | Barr | 174/152 |
| 3,979,187 | 9/1976 | Scherer | 29/195 |
| 4,128,697 | 12/1978 | Simpson | 428/433 |
| 4,213,004 | 7/1980 | Acker et al. | 174/151 |
| 4,292,464 | 9/1981 | Vogt et al. | 174/152 |
| 4,352,951 | 10/1982 | Kyle | 174/152 |
| 4,461,926 | 7/1984 | Kyle | 174/152 |
| 4,587,144 | 5/1986 | Kellerman et al. | 428/36 |
| 4,593,758 | 6/1986 | Kyle | 166/65.1 |
| 4,737,601 | 4/1988 | Gartzke | 174/152 |
| 4,833,049 | 5/1989 | Teaford et al. | 429/181 |
| 4,841,101 | 6/1989 | Pollock | 174/152 |
| 4,915,719 | 4/1990 | Saffari | 65/32.2 |
| 4,935,583 | 6/1990 | Kyle | 174/152 |
| 4,960,391 | 10/1990 | Beinhaur et al. | 439/559 |
| 5,046,971 | 9/1991 | Ruggiero et al. | 174/52.1 |
| 5,194,697 | 3/1993 | Hegner et al. | 174/151 |
| 5,267,684 | 12/1993 | Catheline et al. | 228/262.1 |
| 5,273,203 | 12/1993 | Webster | 228/124.6 |
| 5,308,925 | 5/1994 | Paterek et al. | 174/152 |
| 5,321,307 | 6/1994 | Murai | 257/774 |
| 5,367,125 | 11/1994 | Viret et al. | 174/52.4 |
| 5,525,759 | 6/1996 | Salzman | 174/151 |
| 5,539,611 | 7/1996 | Hegner et al. | 361/283.4 |
| 5,557,074 | 9/1996 | Miyamoto et al. | 174/152 |
| 5,563,562 | 10/1996 | Szwec | 333/260 |
| 5,643,694 | 7/1997 | Heller, Jr. | 429/181 |
| 5,917,150 | 6/1999 | Hampton et al. | 174/50.56 |
| 5,960,537 | 10/1999 | Vicich et al. | 29/843 |

*Primary Examiner*—Dean A. Reichard
*Assistant Examiner*—Dhiru R Patel
*Attorney, Agent, or Firm*—Wiggin & Dana; Gregory S. Rosenblatt

[57] ABSTRACT

A conductive feedthrough for providing electrical current to semiconductor packages. A conductive wall portion of a semiconductor package contains an insulating material disposed in an aperture in the conductive wall. The insulating material has an axial bore into which an electrical conductor is inserted. The conductor has a reduced diameter in the portion inside the axial bore and enlarged portions on either side of the axial bore.

16 Claims, 3 Drawing Sheets

DUPLEX FEEDTHROUGH AND METHOD THEREFOR

BACKGROUND OF THE INVENTION

1. Field of the Invention

This invention relates generally to a feedthrough circuit assembly and a method for providing a conductor of electrical current through a conductive wall or enclosure. More particularly, this invention relates to a 0.060 inch current feedthrough having a 0.040 inch diameter center conductor that is brazed to an insulating material for providing electrical conduction through the insulating material.

2. Brief Description of the Art

The prior art is replete with various means and methods for providing electrical conduction between semiconductor devices. A prior art method for providing an electrical pass or feedthrough connection between opposing sides of a conductive wall typically uses a glass insulating material disposed in a through-bore formed in the wall. The glass insulating material covers the feedthrough conductor and thereby insulates the conductor from the wall of an equipment housing or other walled enclosure through which the conductor passes.

U.S. Pat. No. 4,292,464, issued Sep. 29, 1981 to Vogt et al., discloses a glass pass-through with an additional insulator for a lengthening a leakage path. This pass-through has a glass part disposed in an opening formed in a metal case. The insulator for lengthening the leakage path is connected to one end of the glass part and to an electric conductor. The connection between the insulator and the glass part includes a fused glass junction.

U.S. Pat. No. 5,194,697, issued Mar. 16, 1993 to Hegner et al., discloses an electrically conductive feedthrough connection. A mechanically heavily loadable and high-vacuum-tight feedthrough is connected through a hole in a high temperature-resistant and vacuum-proof insulating portion that could be ceramic, glass or a single crystal. The feedthrough circuit is disclosed as preferably used in a capacitive pressure sensor having a diaphragm and a substrate.

U.S. Pat. No. 4,935,583, issued Jun. 19, 1990 to Kyle, discloses an insulated conductor with ceramic-connected elements. An electrical conductor that has a particular coefficient of thermal expansion is bonded to an electrical insulator having a relatively similar coefficient of thermal expansion. The bonding material is a ceramic material having a similar coefficient of thermal expansion as the electrical insulator. The bonding is accomplished by disposing the ceramic material between the electrical conductor and the electrical insulator and by subjecting the ceramic material to a controlled amount of heat, which may be applied by a laser beam. The heat created by the laser causes the ceramic material to flow in the space between the electrical conductor and the electrical insulator, thereby bonding the electrical conductor and the electrical insulator.

U.S. Pat. No. 5,539,611, issued Jul. 23, 1996 to Hegner et al., discloses an interface connection through an insulating part. This interface connection is through a hole in a high temperature-resistant and vacuum-proof insulating part, and consists of a metallic lead inserted into the hole and having a coefficient of thermal expansion less than that of the insulating part. One end of the lead is flush with a surface of the insulating part and is covered with an active brazing material, which seals it to the insulating part.

U.S. Pat. No. 3,901,772, issued Aug. 26, 1975 to Guillotin et al., discloses a method of sealing of a metal part on a ceramic part by brazing. This method creates a fluid-tight sealing joint between a metal part and a ceramic material. The ceramic part is metallized by the application of a metallization product containing a metallic derivative, and sintering the product. The ceramic part is then nickel coated. This method requires repeated coatings of metallization and two nickel layers.

As can be seen from the illustrative background discussed above, there is a need for a method and apparatus that enables a conductor having a varying diameter to provide a current path through a ceramic insulating material. As increased power is required in semiconductor devices, larger diameter leads are required and/or leads with lower resistance. Standard package sizes and external lead diameter are fixed by industry and government standards. Packages with 0.060 inch diameter external leads have become standards, but are not capable of being produced with low resistance materials. The mismatch in thermal expansion between the external lead and the ceramic material to which the lead is joined becomes problematical as the external lead approaches 0.060 inches in diameter. This mismatch in thermal expansion can cause a failure in the joint, the lead, or the ceramic material.

BRIEF SUMMARY OF THE INVENTION

The invention meets the industry and government standard outline drawing by providing a 0.060 inch diameter external lead with low resistance having a smaller diameter that passes through a ceramic material. The smaller diameter section reduces cracking of the surrounding material and yet maintains electrical conductivity through the material.

In one embodiment, the instant invention enables an electrical conductor with multiple sections, each having distinct diameters, to conduct electrical current through an axial bore in an insulating material, which is disposed within a conductive material. The assembly design prevents electrical current that is conducted through the conductor to short circuit to the surrounding conductive material. One embodiment of the instant invention is a feedthrough interconnection assembly having a conductive wall that has one or more apertures and an insulating material disposed in each aperture. The insulating material has an axial bore. A feedthrough conductor extends through the axial bore and has a first section and a second section. The outer diameter of the second section is smaller than the outer diameter of the first section for at least the length of the axial bore.

The second section passes through the insulating material such that the outer diameter of the second section has a relatively close fit with an interior wall of the axial bore.

A second embodiment of the instant invention is a feedthrough interconnection assembly having a conductive wall with at least one aperture extending therethrough. An insulating material is disposed in each aperture and has an axial bore extending therethrough. A feedthrough conductor passes through the insulating material such that the outer surface of the conductor has a relatively close fit with an interior wall of the axial bore. A first outer covering surrounds a first portion of the feedthrough conductor in a sleeve-like fashion and is brazed to the feedthrough conductor. A second outer covering surrounds a second portion of the feedthrough conductor in a sleeve-like fashion and is brazed to the second portion of the feedthrough conductor.

A third embodiment of the instant invention is a method for producing a feedthrough interconnection comprising the steps of providing a planar conductive wall portion having at least one aperture extending therethrough. Insulating material is disposed in each aperture and an axial bore is formed in the insulating material. The bore extends perpendicular to the wall and substantially concentric with the aperture. The insulating material is disposed as an annular element in the aperture therethrough. A feedthrough conductor having first and second sections is passed through the insulating material such that the outer surface of the second section has a close fit with an interior wall of the axial bore.

A fourth embodiment of the instant invention is a method of producing a feedthrough connector assembly comprising the steps of providing a conductive wall having at least one aperture extending therethrough. Next, a conductor is passed through an axial bore in an insulating material in the conductive wall such that the outer surface of the conductor has a close fit with an interior wall of the axial bore. A first portion of the conductor is brazed with an outer sleeve. Finally, a second portion of the conductor is covered with an outer sleeve and the sleeve is brazed to the conductor.

DETAILED DESCRIPTION OF THE INVENTION

A transistor outline ("TO") style header, which is a government standard, is used for providing electrical current to semiconductor packages enclosed or otherwise housed in metallic housings. The basis of the TO style header is a 0.060 inch diameter conductor or lead that meets the performance requirements of specific package designs. The connection of semiconductor packages that provides a hermetic package is useful in applications such as motor controls and automotive rectifiers. The 0.060 inch diameter feedthrough meets the requirements mandated by the government both physically and electrically. The instant invention describes a method and apparatus for producing an electrical conductor having a 0.060 inch exterior diameter with a smaller portion that is passed through an insulating grommet or annulus inserted into a wall of the enclosure. This enables the desired 0.060 diameter lead to reduce cracking because the smaller diameter section does not exert as great an expansion force due to thermal expansion.

Figure 1:
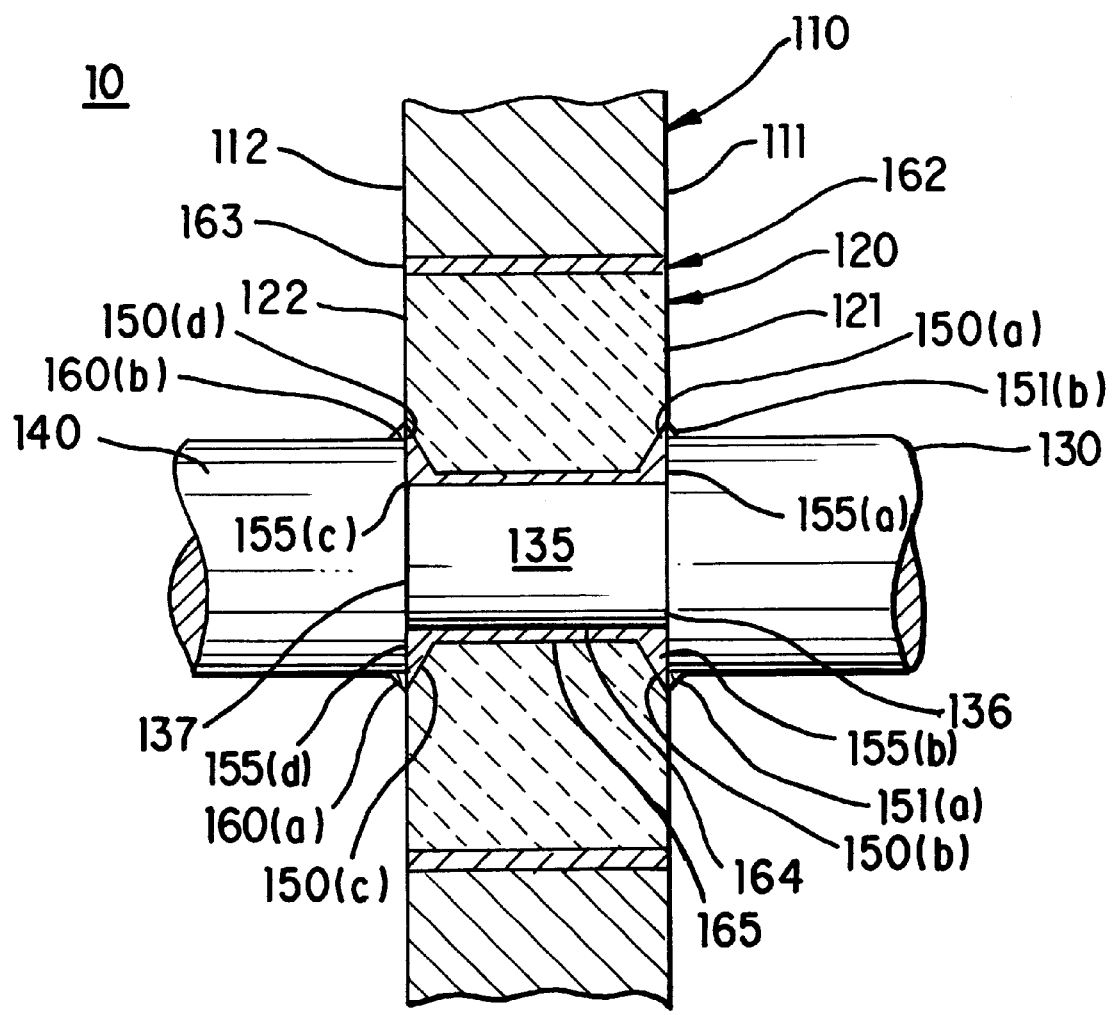
FIG. 1 is a partial sectional side view of a ceramic annulus and a surrounding wall portion and shows a feedthrough conductor passing through the annulus with three conductor sections.

FIG. 1 shows an assembly 10 including a conductive material 110 forming a planar surface (i.e., wall) in a semiconductor circuit package (not shown) for the purpose of giving the package mechanical strength and protecting the contents placed in a cavity within the package. The conductive wall material is typically a metal such as titanium, copper, tungsten, molybdenum, or metallic alloys of one or more metals such as nickel-iron, nickel-chromium-iron, nickel-cobalt-iron, and nickel-chromium. The conductive wall structure 110 has an aperture 162 that extends from a first side 111 of the conductive wall 110 to a second side 112 of the conductive wall 110 and is substantially perpendicular to those surfaces 111, 112. The aperture 162 may be any desired shape. The wall structure 110 may have a plurality of apertures, but only aperture 162 will be described in detail in this specification.

Disposed within aperture 162 is an insulating material 120. The insulating material 120 is typically selectively coated with a metallization material shown as 163 and 165, containing, for example, tungsten, molybdenum, manganese iron, or titanium oxide. The coating is used to enhance connection of the insulating material 120 to the conductive wall 110. Metallization is well known in the art and U.S. Pat. No. 3,901,772, issued to Guillotin et al., describes one possible method. U.S. Pat. No. 3,901,772 is hereby incorporated by reference in its entirety herein. The insulating material 120 is joined to the conductive wall 110, for example by brazing, and forms a planar surface substantially perpendicular to the aperture 162. The insulating material 120 is typically made from a material such as magnesium oxide, silica, or alumina or any other suitable inorganic or ceramic material which will provide the desired electrical insulating properties to the interface between the conductor sections 130, 135 and 140 and the conductive wall structure 110. Ceramic materials are preferred because of physical characteristics such as high electrical resistivity. Ceramic materials are also highly resistant to strong acids and bases and have excellent electrical insulation characteristics, having electrical resistivity as high as $10^{18}$ ohms. Ceramic insulators can be readily formed into desired shapes to fit the shape of apertures in the wall, such as annular in the case where the wall has an aperture of circular cross-section.

This insulating material 120 is disposed in the aperture 162 of the conductive wall 110. The insulating material 120 has an axial bore 164 that is substantially perpendicular to the insulating material surface and extends from a first side of the insulating material 121 to a second side 122 of the insulating material 120. The axial bore 164 typically has one or more pilot holes or chamfers 150(a), (b), (c) and (d). These chamfers 150(a) . . . (d) increase the dimension of the axial bore 164 thereby permitting increased flow of a brazing material (shown at locations 155(a), (b), (c) and (d)) towards the interior of the axial bore 164 while the brazing material is in a molten state. The bore 164 can be any shape or dimension suitable for receiving a conductor. The bore 164 also has metallization-coating 165 deposited on desired portions of the interior surface of the axial bore 164. The coating 165 on the interior surface of the bore 164 facilitates brazing the conductor 135 to the insulating material 120.

The feedthrough conductor has three adjoining sections 130, 135 and 140. One possible method of joining sections 130, 135 and 140 is to braze section 135 to section 130 and to section 140 while brazing all three sections with the insulting material 120. This braze is any brazing compound known in the art. Examples of brazing materials include silver, an alloy of copper and silver, gold and copper alloy, gold and germanium alloy, and gold and tin alloy. The brazing is usually applied in a furnace with a protective atmosphere of nitrogen with some hydrogen to prevent oxidation and to promote good wetting of the braze.

Alternatively, section 135 could first be joined to one of either section 130 or section 140 and then brazed to the remaining section (either 130 or 140 depending on which one was first joined to section 135) while brazing section 135 to the insulating material 120.

Conductor sections 130, 135 and 140 may be any shape but are typically of circular cross-section, and may be comprised of an electrically conductive material such as copper, copper alloy, nickel, nickel alloy, niobium, or molybdenum. A preferred material is "GLIDCOP", ("GLIDCOP" is a trademark of S.C.M. Metal Products, Inc., Research Triangle Park, N.C.) which is a copper alloy that has the desired electrical conductivity and maintains its yield strength and hardness when exposed to high temperatures required in brazing.

The first section 130 has a diameter that is larger than the diameter of the second section 135. For example, the diameter of the first section may be between 1.1 and 3.5 times as large as the diameter of the second section, preferably, 1.3 to 2.0 times as large and most preferred 1.5 times as large. The third section 140 has a diameter approximately equal to the diameter of the first section 130.

Typically, the diameter of the first section 130 is between 0.040 and 0.080 inches, more preferably between 0.050 and 0.070 inches and most preferred 0.060 inches. The first section 130 and the third section 140 can have any suitable length and are typically between 0.20 to 2.0 inches in length and preferably between 0.5 and 1.5 inches in length.

The second section 135 has a first end portion 136 that connects to the first section 130 and a second end portion 137 that connects to the third section 140. This second section 135 has a diameter less than the diameter of the first section 130 and the third section 140. The second section 135 typically has a diameter of approximately 0.005 inches to 0.055 inches and preferably between 0.020 inches and 0.050 inches and most preferably 0.040 inches. This second section 135 may be created by turning down a selected portion of the larger diameter first section 130 or by any technique known in the art. The length of section 135 is typically approximately the length of the bore of the insulating material 120. The length is typically between approximately 0.005 inches and 0.5 inches. However, the length of the section 135 can be any desired length. Section 135 can have any shape that enables joining to the insulating material 120. Examples of joining pins to materials in electronic packages are found in U.S. Pat. No. 5,046,971 issued Sep. 10, 1991 to Ruggerio et al., entitled, "Terminal Pins for Flexible Circuits", which is hereby incorporated by reference it in its entirety herein. The three sections 130, 135 and 140 can be made of the same material or each can be made of a different material. For example, sections 135 and 140 could be made of "GLIDCOP" ("GLIDCOP" is a trademark of S.C.M. Metal Products, Inc., Research Triangle Park, N.C.) for stiffness and bondability and section 130 could be made of copper.

The second section 135 has a close fit with the interior surface of axial bore 164. This fit could also be an interference fit. The clearance of the second section 135 in the axial bore 164 is typically between 0.0005 inches and 0.01 inches, depending on the desired fit. A clearance of 0.002 inches has been found to provide a close fit and also permit braze material to be disposed between the conductor and the insulating material, which enables a secure joint between the conductor and the insulating material 120. The second section 135 is suitably brazed to the metallized coating 165 of the insulating material 120.

In an embodiment in which the insulating material 120 has been coated with a metallization material on surfaces 121 and 122, (metallization coating on surfaces 121 and 122 is not shown) the first section 130 and the third section 140 may be brazed to the insulating material 120 at sites 151(a) and (b) and sites 160(a) and (b) respectively.

The brazing material is suitably a material such as silver, copper, gold copper alloy, or a metallic alloy, for example the alloys silver-copper, or gold-nickel.

Figure 2:
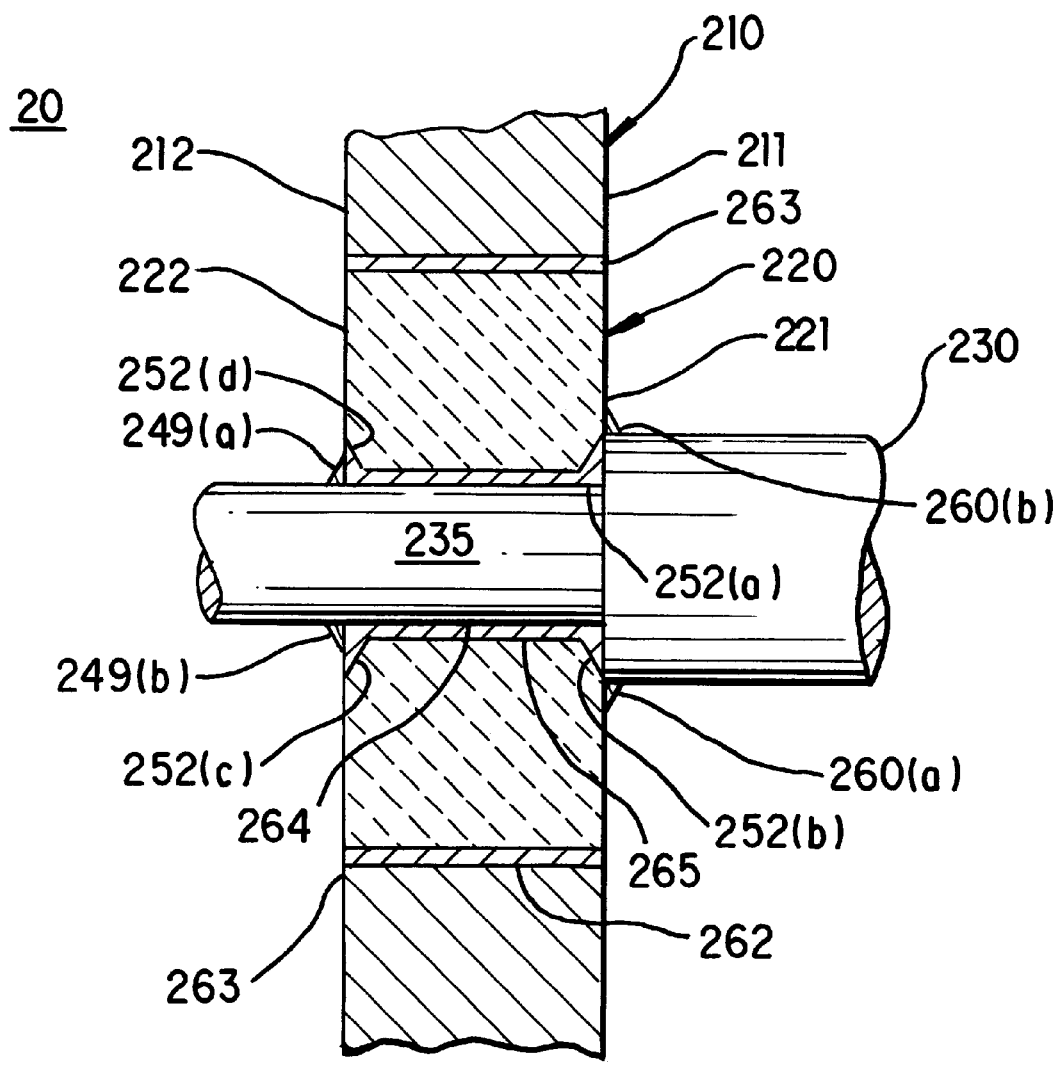
FIG. 2 is a partial sectional side view of a ceramic feedthrough conductor of the instant invention having two conductive sections.

FIG. 2 shows a second embodiment of the instant invention 20. This embodiment, although similar to assembly 10 as shown in FIG. 1, utilizes only a first conductor section 230 and a second conductor section 235. A conductive wall 210 is suitably constructed from a conductive material, and forms a planar surface. The wall 210 may have a plurality of apertures, represented as aperture 262, which extend from a first side 211 of the conductive wall 210 to a second side 212 of the conductive wall 210. The aperture 262 can be any shape suitable to receive an insulating material.

An insulating material 220 is disposed within the aperture 262 in the conductive wall 210. The insulating material 220 has an axial bore 264 extending from a first side 221 of the insulating material 220 to a second side 222 of the insulating material 220. The bore 264 may be any shape or dimension suitable to receive a conductor. Within this axial bore 264 is the second section 235 of the electrical conductor. The insulating material 220 is suitably selectively coated with a metallization layer 263 to enhance joining the conductive wall 210 to the insulating material 220, for example by brazing, and brazing the conductor 235 to the interior of the axial bore 264.

The second section 235 has a close fit within the bore. The section has substantially an interference fit with the interior of the axial bore 264. The clearance between the second section 235 and the axial bore 264 is typically less than 0.04 inches and preferably about 0.002 inches. The insulating material 220 may have one or more chamfers 252(a), (b), (c) and (d) for more efficient movement of the brazing material that brazes the second section 235 of the electrical conductor to the insulating material 220.

In an embodiment in which the selective metallization coating is deposited on surface 221 of the insulating material 220, the first section 230 of the electrical conductor may be brazed to the surface 221 at sites 260(a) and 260(b). In an embodiment in which the selective metallization coating is deposited on surface 222, the second section 235 may be brazed to that surface at sites 249(a) and (b).

The diameter of the first section 230 is larger than the diameter of the second section 235. Typically, the diameter of the first section is approximately between 1.1 and 3.5 times the diameter of the second section 235 and most preferred, 1.5 times as large. This difference in diameter provides an efficient and desirable conductor for electrical reliability for the desired applications. Typically, the first section 230 will typically have an outer diameter of approximately 0.050 inches to 0.070 inches and preferably 0.060 inches. The second section 235 will have an outer diameter approximately 0.020 inches to 0.050 inches and preferably 0.040 inches. These dimensions could be accomplished by turning one end of a 0.060 inch diameter lead and brazing it to the insulating material 220.

Figure 3:
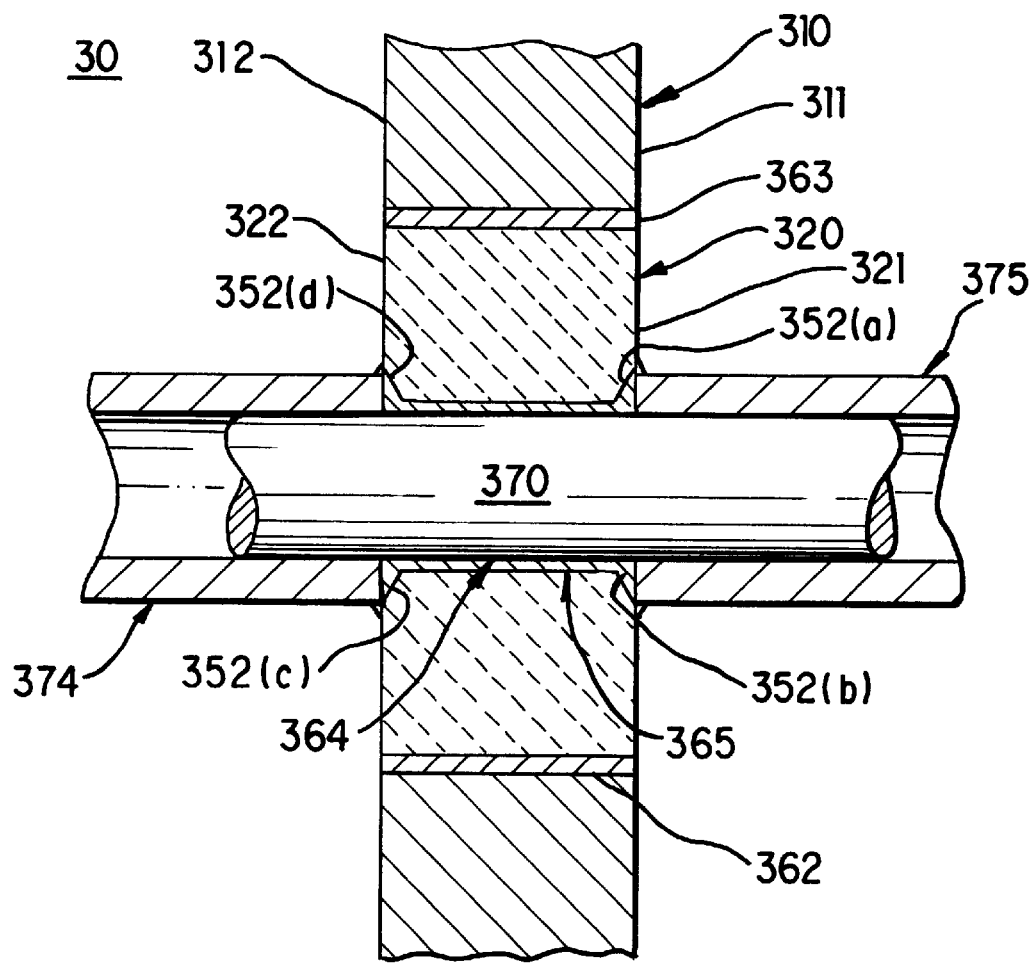
FIG. 3 is a partial sectional side view of another embodiment of the invention wherein the center conductor is of a constant cross-sectional shape covered by conductive sleeve portions.

FIG. 3 shows a third embodiment 30 of the instant invention. This embodiment, although similar to those described in FIGS. 1 and 2, uses a center conductor connected to outer sleeves. A conductive wall structure 310 is typically between 0.010 to 0.10 inches thick and is typically a conductive material such as those listed in relation to the first and second embodiments, and forms a planar surface. The wall 310 may have a plurality of apertures, represented in FIG. 3 as aperture 362, disposed from a first side 311 of the conductive wall 310 to a second side 312 of the conductive wall 310. The aperture 362 may be any shape suitable to receive desired material. Within aperture 362 is disposed an insulating material 320. The insulating material 320 may be selectively coated with a metallization layer 363 to facilitate brazing the insulating material 320 to the conductive wall 310. The insulating material 320 has an axial bore 364 that extends from a first side 321 of the insulating material 320, to a second side 322 of the insulating material 320. The interior surface of the bore 364 is also coated with the metallization layer 365 so that a conductor 370 may be brazed to the insulating material 320. The insulating material 320 is typically any of the materials listed in relation to the first or second embodiment. The insulating material 320 may also have chamfers 352(a), (b), (c) and (d). These chamfers 352 provide more efficient brazing flow within the axial bore 364.

The center conducting section 370 provides conduction from the first side 321 of the insulating material 320 to the second side 322. The center conducting section 370 is typically an electrically conductive material such those listed in relation to the first and second embodiments. The center conducting section 370 can be any desired shape, but is typically cylindrical. The length of section 370 typically extends beyond the insulating material 320, so that the conducting section 370 can be joined to outer covers 374, 375.

First outer cover 374 and second outer cover 375 are brazed over center conducting section 370. Covers 374 and 375 have a hollow interior that accommodates the center conductor 370 so that the center conductor 370 can be joined to the covers 374 and 375 by a process such as, for example brazing. The covers 374 and 375 are of a shape that enables insertion of the center conductor. These covers 374, 375 extend beyond the insulating material 320, thereby increasing conductive surface area of the center section 370 and are typically made from any conductive material, for example a nickel-iron alloy. The center section 370 is brazed to the insulating material 320 at metallization layer 365. The two outer cover portions 374 and 375 are brazed over the center conductor 370 to increase the diameter of the center conductor 370 on either side of the insulating material 320.

The outer covers can be virtually any desired length and outer diameter. Typically, the outer diameter will be approximately 0.060 inches to meet the TO specifications.

This invention provides a more efficient and improved electrical connection method and apparatus for semiconductor packages by enabling 0.060 inch diameter external leads with a smaller section that is less likely to crack or deform an insulating material. The 0.060 inch lead may be used for the "TO" style headers as typically preferred by many industrial applications.

It is apparent that there has been provided in accordance with this invention a method, an apparatus for providing a multi-diameter electrical interconnection for semiconductor package. While this invention has been described in combination with specific embodiments thereof, it is evident that many alternatives, modifications and variations will be apparent to those skilled in the art in light of the foregoing description. Accordingly, it is intended to embrace all such alternatives, modifications and variations that fall within the spirit and broad scope of the appended claims.

What is claimed is:

1. A feedthrough interconnection assembly comprising:
   a conductive wall portion forming a substantially planar surface, having at least one aperture extending therethrough;
   an insulating material disposed in the aperture having an axis and an axial bore extending therethrough, the axis of said bore being substantially perpendicular to the planar surface of the wall portion; and
   a feedthrough conductor having:
   a first section with a first diameter; and
   a second section with a second diameter extending through the axial bore, the second diameter being less than the first diameter and a third diameter of the bore being effective to form a close fit with the second section.

2. The assembly as claimed in claim 1 further comprising:
   a brazing material disposed between the second section and the axial bore for fixedly mounting the second section to the insulating material.

3. The assembly as claimed in claim 2 wherein the feedthrough conductor further comprises:
   a third section, connected to the second section at a position opposite the first section and having a fourth diameter substantially equal to the first diameter.

4. The assembly as claimed in claim 2 wherein the first diameter is approximately between 1.1 and 1.8 times the second diameter.

5. The assembly as claimed in claim 2 wherein:
   the second diameter is approximately between 0.02 and 0.05 inches; and
   the first diameter is between approximately 0.05 and 0.07 inches.

6. The assembly as claimed in claim 2 wherein the feedthrough conductor includes a material selected from the group consisting of copper, copper alloy, titanium, iron alloy, nickel alloy and niobium.

7. The assembly as claimed in claim 1 wherein the insulating material is selected from the group consisting of inorganic compounds and ceramics.

8. A feedthrough interconnection assembly comprising:
   a conductive wall having at least one aperture extending therethrough;
   an insulating material disposed in the aperture having an axis and an axial bore extending therethrough; and
   a feedthrough conductor having a center section extending through the insulating material such that the center section has a close fit with an interior wall of the axial bore;
   a first conductive outer covering surrounding a first portion of the center section on a first side of the insulating material in a sleeve-like fashion; and
   a second outer covering surrounding a second portion of the center section on a second side of the insulating material in a sleeve-like fashion.

9. The assembly as claimed in claim 8 further comprising a brazing material disposed between the center section and the axial bore for fixedly mounting the center section to the insulating material.

10. The assembly as claimed in claim 8 wherein the first and second outer coverings have a diameter approximately between 1.1 and 1.8 times the diameter of the center section.

11. The assembly as claimed in claim 8 wherein the first and second outer coverings are approximately between 0.05 and 0.07 inches in diameter and the center section is approximately between 0.02 and 0.05 inches in diameter.

12. A method for producing a feedthrough interconnection comprising the steps of:
   providing a conductive wall having at least one aperture extending therethrough;
   mounting an insulating material in the aperture, the insulating material having an axial bore extending therethrough;
   providing a feedthrough conductor having first and second sections having respective first and second diameters, wherein the second diameter is smaller than the first diameter; and passing the second section through the insulating material such that the second section has a close fit with an interior wall of the axial bore while the first section remains on one side of said insulating material.

13. The method as claimed in claim 12 further comprising the step of brazing the second section to the axial bore thereby fixedly mounting the second section to the insulating material.

14. The method as claimed in claim 12 further comprising providing a third section, connected to the second section at a position opposite the first section and the third section having a third diameter substantially equal to the first diameter.

15. A method of producing a feedthrough connector comprising the steps of:

providing a substantially planar conductive wall having at least one aperture extending therethrough perpendicular to a plane thereof;

fixedly mounting an annulus composed of insulating material in the aperture in a close mating relationship, the annulus having an axial an an axial bore extending therethrough with the axis substantially perpendicular to the plane of said wall;

passing a feedthrough conductor center section through the annulus, the center section having an outer diameter substantially equal to the diameter of the axial bore whereby the conductor has a close fit with an interior wall of the axial bore;

covering a first portion of the center section on a first side of the insulating material with a first outer sleeve of conductive material; and covering a second portion of the center section on a second side of the insulating material with a second outer sleeve of conductive material.

16. The method as claimed in claim 15 further comprising the step of brazing the center section to a surface of the axial bore for fixedly mounting the conductor to the insulating material.

* * * * *